(12) United States Patent
Driessen et al.

(10) Patent No.: US 11,968,771 B2
(45) Date of Patent: Apr. 23, 2024

(54) VOLTAGE WAVEFORM GENERATOR FOR PLASMA PROCESSING APPARATUSES

(71) Applicant: PRODRIVE TECHNOLOGIES INNOVATION SERVICES B.V., Son en Breugel (NL)

(72) Inventors: Antonius Wilhelmus Hendricus Johannes Driessen, Groningen (NL); Wouter Johan Hendrik Van Gennip, Eindhoven (NL)

(73) Assignee: Prodrive Technologies Innovation Services B.V., Son en Breugel (NL)

( * ) Notice: Subject to any disclaimer, the term of this patent is extended or adjusted under 35 U.S.C. 154(b) by 561 days.

(21) Appl. No.: 17/291,976

(22) PCT Filed: Nov. 6, 2019

(86) PCT No.: PCT/EP2019/080405
§ 371 (c)(1),
(2) Date: May 6, 2021

(87) PCT Pub. No.: WO2020/094723
PCT Pub. Date: May 14, 2020

(65) Prior Publication Data
US 2022/0013330 A1    Jan. 13, 2022

(30) Foreign Application Priority Data

Nov. 9, 2018  (EP) .................................... 18205472
Dec. 17, 2018 (NL) ..................................... 2022222

(51) Int. Cl.
*H05H 1/46* (2006.01)
*H01J 37/32* (2006.01)

(52) U.S. Cl.
CPC ..... *H05H 1/4652* (2021.05); *H01J 37/32146* (2013.01); *H01J 37/32183* (2013.01); *H01J 2237/332* (2013.01); *H01J 2237/334* (2013.01)

(58) Field of Classification Search
CPC .............. H05H 1/4652; H01J 37/32146; H01J 37/32183; H01J 2237/332; H01J 2237/334
See application file for complete search history.

(56) References Cited

U.S. PATENT DOCUMENTS 6,979,980 B1    12/2005  Hesterman et al.
9,208,992 B2 *  12/2015  Brouk .................... H01J 37/24
(Continued)

FOREIGN PATENT DOCUMENTS

EP    0987818 A2    8/1999
EP    0987818 A3    8/1999
(Continued)

OTHER PUBLICATIONS

International Search Report and Written Opinion of the International Searching Authority from the European Patent Office, in PCT/EP2019/080405 dated Jan. 17, 2020, which is an international application corresponding to this U.S. application.

*Primary Examiner* — Henry Luong
(74) *Attorney, Agent, or Firm* — Kolitch Romano Dascenzo Gates LLC (57) ABSTRACT

A plasma processing apparatus may include a mechanism for generating a plasma, a processing platform for supporting a substrate to be processed, and a voltage waveform generator having an output electrically coupled to the processing platform. The voltage waveform generator includes a plurality of first buck converters arranged in parallel and coupled to the output. The first buck converters include actively switchable semiconductor switches. A control unit is configured to operate the actively switchable semicon- (Continued)

ductor switches through pulse width modulation signals, and the control unit is configured to operate the plurality of first buck converters in an interleaved manner.

20 Claims, 7 Drawing Sheets

(56) References Cited

U.S. PATENT DOCUMENTS

2013/0009479 A1 1/2013 Khanna et al.
2017/0291245 A1 10/2017 Chin et al.

FOREIGN PATENT DOCUMENTS

| JP | 2012050296 A | 3/2012 |
| JP | 2017079127 A | 4/2017 |
| WO | 9515612 A1 | 6/1995 |

* cited by examiner

VOLTAGE WAVEFORM GENERATOR FOR PLASMA PROCESSING APPARATUSES

TECHNICAL FIELD

The present disclosure is related to plasma processing apparatuses comprising a voltage waveform generator.

INTRODUCTION

In plasma assisted etching and plasma assisted layer deposition, radio frequency (RF) generators are used to generate a bias voltage for controlling the ion energy. To improve process control, accurate control of the bias voltage and the resulting ion energy distribution is of importance. Generating this bias voltage is done with limited efficiency (wideband) linear amplifiers or with limited flexibility (narrowband) switch-mode amplifiers or dedicated pulse generating amplifiers. Most amplifiers are only indirectly controlling the output voltage waveform (e.g. controlling output power or relying on calibration). Due to non-idealities and parameter variation in the system, this approach is resulting in limited performance (the generated waveform is less close to the desired output voltage waveform, resulting in a less desired ion energy distribution) and limited reproducibility (wafer to wafer variation and system to system variation).

U.S. Pat. No. 9,208,992 describes a plasma processing apparatus comprising a switch mode power supply for forming a periodic voltage function at an exposed surface of the substrate to be processed. The periodic voltage function effectuates a desired ion energy intensity distribution to perform etching of the substrate or plasma deposition on the substrate. The switch mode power supply can be realized by buck, boost and/or buck-boost type power technologies. The switch mode power supply comprises two switch components that are coupled in a half-bridge and are controlled based on drive signals generated by a controller.

A disadvantage of the above switch mode power supply is that it can only generate a block shape waveform with a DC current to compensate for the ion current (see FIG. 14). However, in current plasma-based processing apparatuses, there is a tendency to apply direct voltage control of the bias by a tailored waveform. Therefore, there is a need in the art of a voltage waveform generator that has a desired flexibility to provide an arbitrary waveform with possibly high bandwidth. However, to obtain such high bandwidth with the above power supplies would impose an extremely high switching frequency on the switching components, which is unfeasible.

The RF amplifiers used to generate sinusoidal bias voltage waveform have typically a 50 Ohm output impedance. A matching network (called match box in the industry, which is placed between the amplifier and the substrate table) is used to convert the complex plasma impedance to a real 50 Ohm impedance. Depending on the process conditions, this results in high reactive current through the matching network, which result in significant losses. This makes matching boxes expensive system components.

SUMMARY

Various chemical processes are performed through assistance of a plasma, some of which require a high precision, whereas others require a high power. Current plasma processing apparatuses do not allow sufficient flexibility to address both needs, or provide such flexibility at increased cost or at the expense of operational efficiency. It is an aim of the present disclosure to overcome the above drawbacks. It is an aim of the present disclosure to provide a voltage waveform generator, such as in a plasma processing apparatus, which allows for generating a large variation of desired voltage waveforms with no or limited efficiency loss.

It is an aim of the present disclosure to provide plasma processing apparatuses that allow for being used in a variety of operational modes to address the above needs of high precision on the one hand and high power on the other.

It is an aim of the present disclosure to eliminate the need for a matching network for converting the plasma impedance to a 50 Ohm impedance. It is an aim to provide a plasma processing apparatus that does not require such a matching network, and hence wherein such a matching network is absent.

Plasma processing apparatuses of the present disclosure comprise a voltage waveform generator, in particular for producing a voltage bias on the substrate to be plasma processed. The voltage bias is advantageously used for controlling the ion energy in plasma assisted etching or plasma assisted layer deposition.

The plasma processing apparatus, which can be configured for plasma assisted etching, or for plasma assisted layer deposition, comprises means for generating a plasma, a processing platform for supporting a substrate to be processed and a voltage waveform generator comprising an output electrically coupled to the processing platform, e.g. for providing a bias voltage to the platform. The voltage waveform generator comprises a plurality of first buck converters (herein referred to as buck cells) arranged in parallel and coupled to the output, the first buck converters comprising actively switchable semiconductor switches and a control unit configured to operate the actively switchable semiconductor switches through pulse width modulation signals. The control unit is configured to operate the plurality of first buck converters in an interleaved manner.

With a voltage waveform of the above kind, it becomes possible to generate a large variation of desired voltage waveforms, while keeping switching efficiency at high levels.

Advantageously, the voltage waveform generator comprises a plurality of second buck converters arranged in parallel and coupled to the output, the second buck converters comprising actively switchable semiconductor switches which are operated by the control unit. Advantageously, the plurality of first buck converters and the plurality of second buck converters are arranged in parallel. As a result, a parallel arrangement of multiple (two or even more) sets of n interleaved buck converters is obtained, enabling to distribute the current and therefore reduce loading on the semiconductor switches of the individual buck converters.

The buck converters can be coupled via current or voltage. In case of voltage coupling, the voltage waveform generator advantageously comprises a capacitor acting as an input filter.

Optionally, a (high frequency, such as RF) transformer is coupled between the buck converters and the output to increase, or alternatively decrease the output voltage of the buck converters.

A DC blocking capacitor is advantageously coupled between the buck converters and the output. In case a transformer is provided as indicated above, the DC blocking capacitor is advantageously coupled at the secondary side of the transformer. The DC blocking capacitor advantageously has a capacitance in the range between about 10 pF and about 200 nF, advantageously between about 100 pF and about 100 nF. Such a DC blocking capacitor advantageously prevents saturation of the transformer, and even in case the transformer is omitted, to reduce voltage stress on the semiconductor switches of the buck converter since the DC bias voltage is placed over the blocking capacitor instead of over the semiconductors, enabling the use of more economical semiconductor switches, and hence obtaining a more economical voltage waveform generator.

Advantageously, the voltage waveform generator comprises a linear power amplifier coupled to the output, advantageously in parallel with the first buck converters. Each set of interleaved buck converters (e.g., the first and second buck converters) can have a separate linear power amplifier coupled in parallel. The linear power amplifier is advantageously operated through the control unit. Such a linear power amplifier allows to increase the bandwidth of the voltage waveform generator and/or to reduce the switching speed of the semiconductor switches of the buck converters. Hence, more economical semiconductor switches can be used and/or voltage waveforms of higher frequency can be generated.

According to another aspect, a method of controlling or operating a plasma processing apparatus is described herein.

BRIEF DESCRIPTION OF THE DRAWINGS

Aspects of the present disclosure will now be described in more detail with reference to the appended drawings, wherein same reference numerals illustrate same features and wherein.

DETAILED DESCRIPTION

Plasmas can be complex and different recipes (used chemicals and process settings) have different requirements on IED, and hence on the desired bias voltage waveform. In this disclosure a flexible wideband arbitrary voltage waveform generator (ABVG) is proposed with a high efficiency switched mode architecture. The ABVG can optionally be assisted with performance increasing linear amplifiers (resulting in a higher overall system bandwidth).

Figure 1:
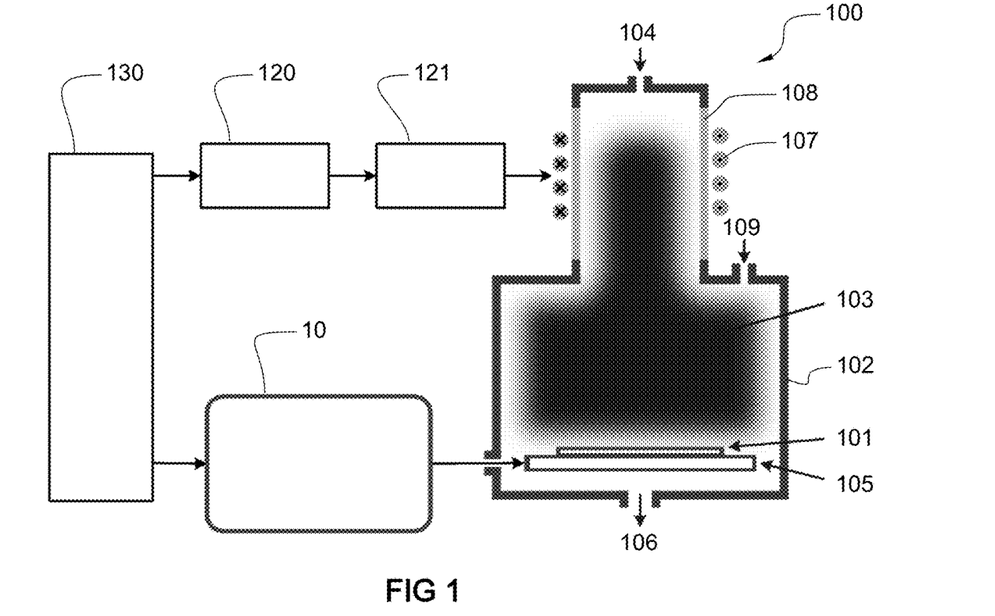
FIG. 1 represents an example of a voltage waveform generator used as bias generator for an ICP (Inductively Coupled Plasma) reactor according to aspects of the present disclosure.
Figure 2:
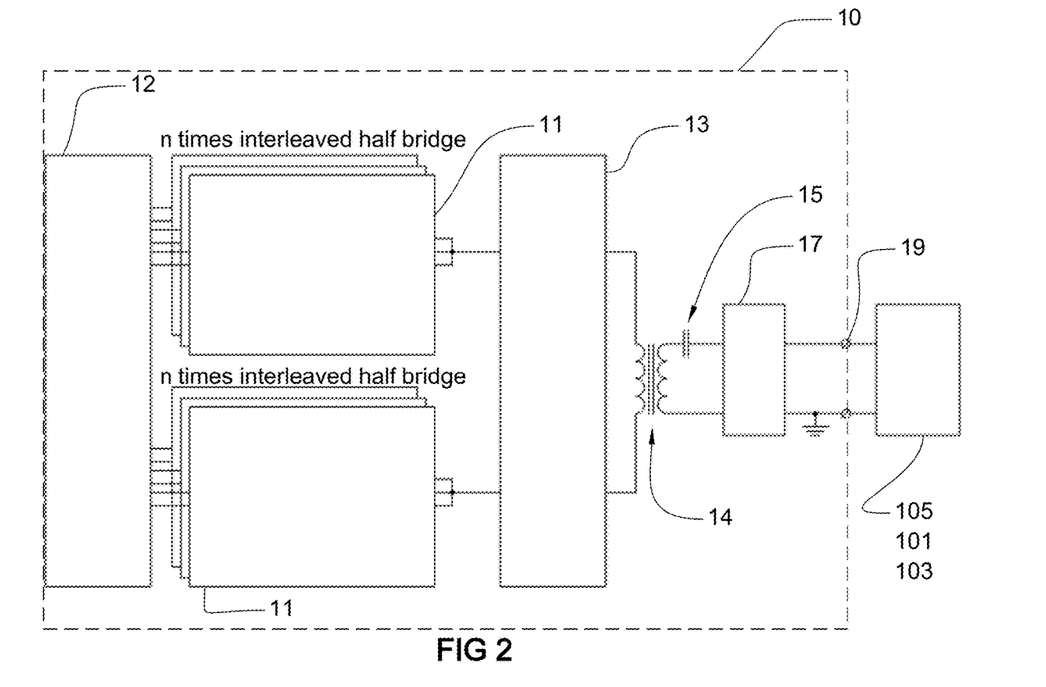
FIG. 2 represents a block diagram of a voltage waveform generator according to the present disclosure.
Figure 3:
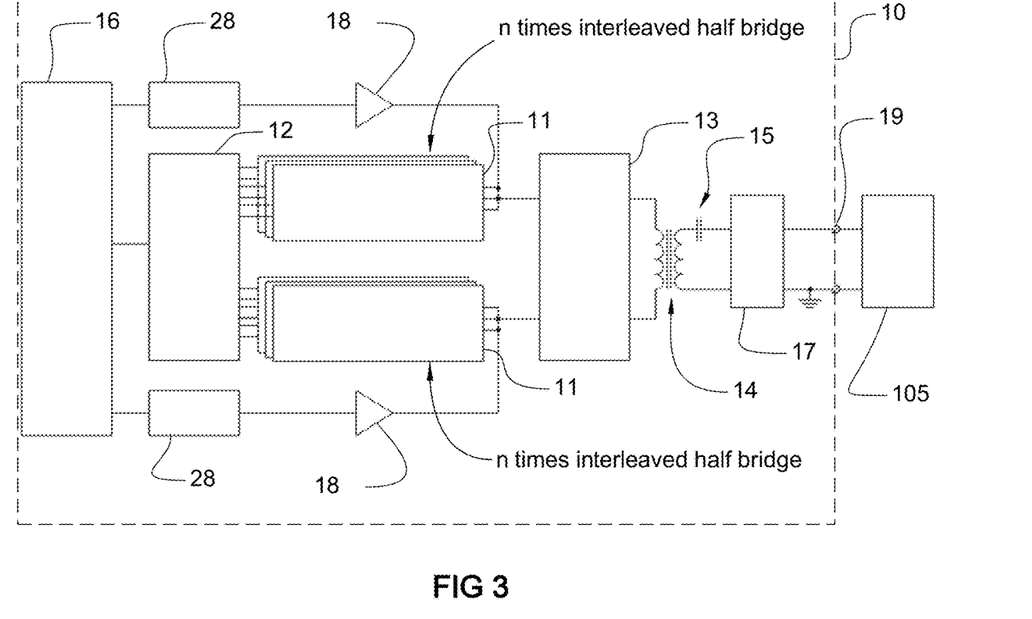
FIG. 3 represents a second block diagram of another voltage waveform generator according to the present disclosure which differs from the diagram of FIG. 2 in that linear power amplifiers are added in parallel with the interleaved buck cells.

FIG. 1 shows one of the typical usages of the ABVG 10 in an Inductively Coupled Plasma (ICP) apparatus 100, where the ABVG 10 is controlling the substrate 101 (typically a wafer) voltage by controlling the substrate stage voltage. In a plasma reactor 102, a plasma 103 is generated by introduction of a plasma forming gas 104 in a dielectric tube 108 surrounded by an induction coil 107. The arrangement forms a plasma torch which directs the plasma 103 towards a stage or platform 105 on which the substrate 101 is positioned. A RF voltage is applied to the induction coil 107 through a RF power supply 120, and a matching network 121 as known in the art. Optionally, a precursor 109 can be introduced in the plasma reactor 102. The RF power supply 120 and the ABVG 10 can be controlled by a system host controller 130.

The ABVG 10 can also be used in other configurations like:

In a Capacitively Coupled Plasma (CCP) reactor;
Direct inter connection (not via the system host) of control signals between source power generator (RF power supply) and ABVG is possible.

A different source could be used to generate the plasma (e.g. Capacitively Coupled Plasma, Electron Cyclotron Resonance, Magnetron, DC voltage, etc.).

Figure 4:
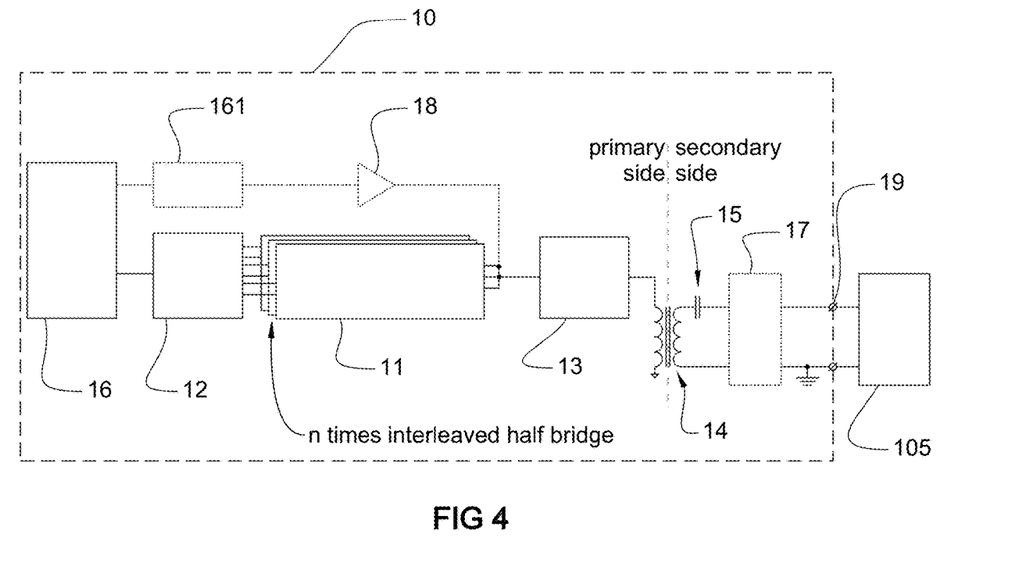
FIG. 4 represents a third block diagram of yet another voltage waveform generator according to the present disclosure which differs from the diagram of FIG. 2 or FIG. 3 in that only one set of interleaved buck cells is provided in asymmetry with respect to the transformer.
Figure 5:
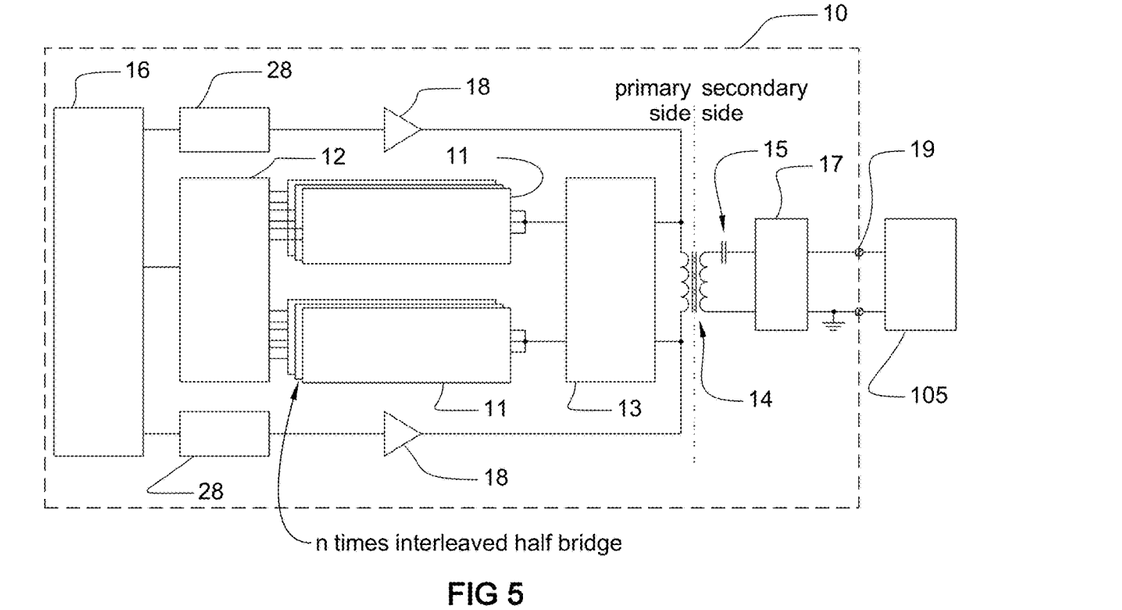
FIG. 5 represents a fourth block diagram of yet another voltage waveform generator according to the present disclosure which differs from the diagram of FIG. 3 in that the linear power amplifiers are coupled in parallel with the interleaved buck cells and the (primary) filter.
Figure 6:
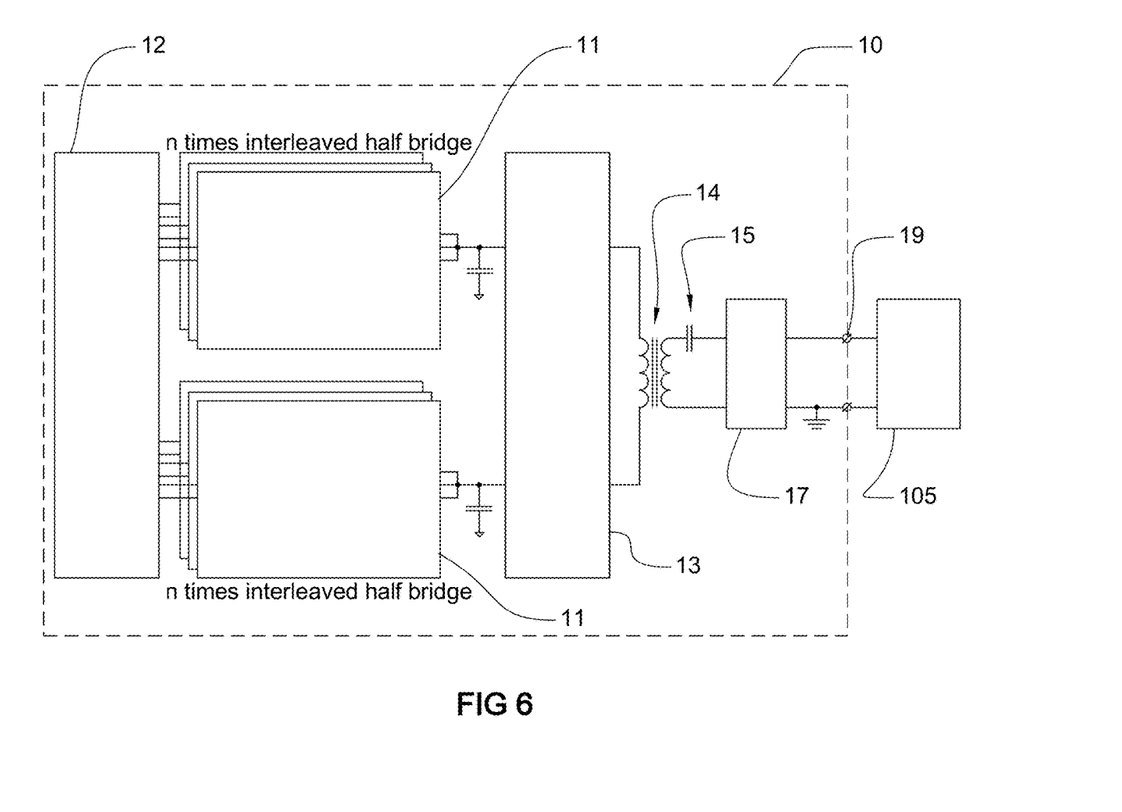
FIG. 6 represents a fifth block diagram of yet another voltage waveform generator according to the present disclosure which differs from the diagram of FIG. 2 in that the sets of interleaved buck cells are coupled through capacitors.

Possible system architectures of the voltage waveform generator according to the present disclosure are shown in FIGS. 2-6. FIG. 4 is the most basic scheme.

Figure 7:
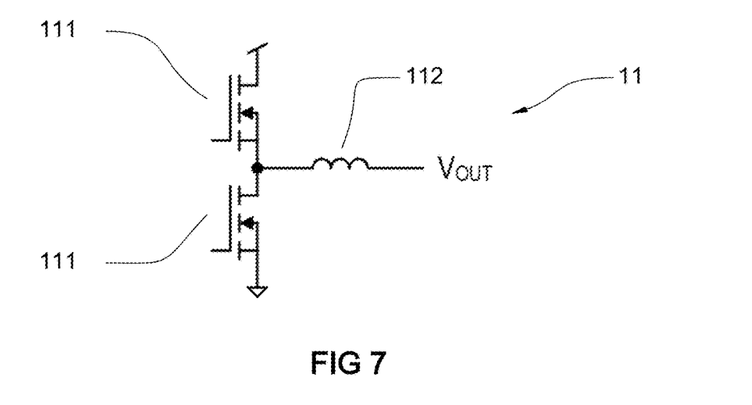
FIG. 7 represents an electric scheme of a single buck cell as can be used in FIGS. 2-6.

Referring to FIGS. 2-6, the desired output voltage at output terminals 19 of the voltage waveform generator 10 is generated by pulse width modulation (PWM) controlled Buck cells 11. A possible implementation of one such Buck cell 11 is a half bridge comprising actively switchable semiconductor switches 111 as represented in FIG. 7. The PWM is typically generated by a PWM generator 12; e.g. a Field Programmable Gate Array (FPGA). Multiple buck cells 11 can be placed in parallel to distribute the current. The Buck cells PWM will be applied out of phase (i.e. interleaved operation) to reduce the ripple current and increase the effective switching frequency $f_{sw\_eff}$. The Buck cell output voltage is filtered by a filter 13 to remove harmonic components.

Buck cell current sharing can be taken care of by measuring the coil currents of the buck cell and adjusting the PWM signals that control the buck cell in such a way that the current is evenly distributed between the buck cells.

A transformer 14 is increasing (but could also decrease) the filtered Buck cell output voltage by the transformer turn ratio to the level required for the system. The DC bias voltage of the substrate table potential is automatically placed over the DC blocking capacitor 15 after the transformer 14. This is reducing the voltage stress on the transformer 14 and on the Buck cells 11. The DC blocking capacitor 15 is also preventing secondary DC current (e.g. due to a DC potential of the plasma) to saturating the transformer. Prevention of transformer saturation on the primary side can be done by measuring the current and adjusting the generated PWM signals to prevent a DC voltage over the primary side of the transformer, e.g. by controller 16. An (optional) EMC filter 17 is used to filter high frequency components generated the ABVG for normative compliance.

With more complex transformer arrangements it is possible to place more than 2 interleaved half-bridges (buck cells 11) in parallel.

With appropriate voltage levels on the Buck cell power supply and of the desired bias voltage it is possible to omit the transformer 14. Note that possible Buck cell voltage levels are limited by the available semiconductor switches 111.

The transformer output side can comprise multiple tabs enabling the user to select the turn ratio of the transformer and therefore the output voltage range. Alternatively, the ABVG can comprise (internal) relays to switch between a plurality of output voltage settings.

There are limitations to the switching speed of the available semiconductor switches 111. This can be overcome with linear amplifiers 18 which can have a higher bandwidth. To increase the ABVG bandwidth linear power amplifiers 18 can be added for generation of some higher harmonics (which typically contain less energy) at the expense of some efficiency loss. The controller 16 in the ABVG can control both the PWM generation 12 and the (optional) linear power amplifiers 18. The digital output supplied by controller 16 is converted to an analog signal via D/A converters 28 before being fed to the linear power amplifiers 18.

To prevent DC biasing/saturation of the transformer in FIG. 4 a DC blocking capacitor 15 is provided. Alternatively, the transformer primary can be connected to a split bus (shared with the buck cells 11) instead of to ground. The EMC filter in FIG. 4 is optional.

By generation of phase shifted PWM signal for operation of multiple Buck cells in parallel the effective switching frequency $f_{sw\_eff}$ ($f_{sw\_eff}$=n*2*switching frequency of one Buck cell) can be increased. With this topology any waveform can be synthesized by generation of a corresponding PWM signals. A repeating waveform can be seen as a sum of its Fourier components. As rule of thumb the highest frequency that can be generated with this ABVG topology is $f_{sw\_eff}/5$. The more Fourier components that can be made the better the desired voltage waveform is reproduced. With this topology any waveform with Fourier components up to approximately $f_{sw\_eff}/5$ can be generated.

With this topology the Buck cells can be implemented with the for the state-of-the-art best-in-class semiconductor switches (at the moment of writing GaN HEMT devices). These switches can switch very fast resulting in low turn on and turn off loss and therefore a high efficiency. To further increase the efficiency, the converter can be operated in zero voltage switching (ZVS). This can be done by reducing the inductance value of the Buck cell inductor 112.

Implementing a closed loop voltage control system with internal and optional external sensors can further improve voltage waveform generation and reproducibility. The direct control of the bias voltage and therefore the ion velocity can result in a much lower power consumption on system level, compared to what is shown by the state-of-the-art (possibly up to an order of magnitude lower).

Figure 8:
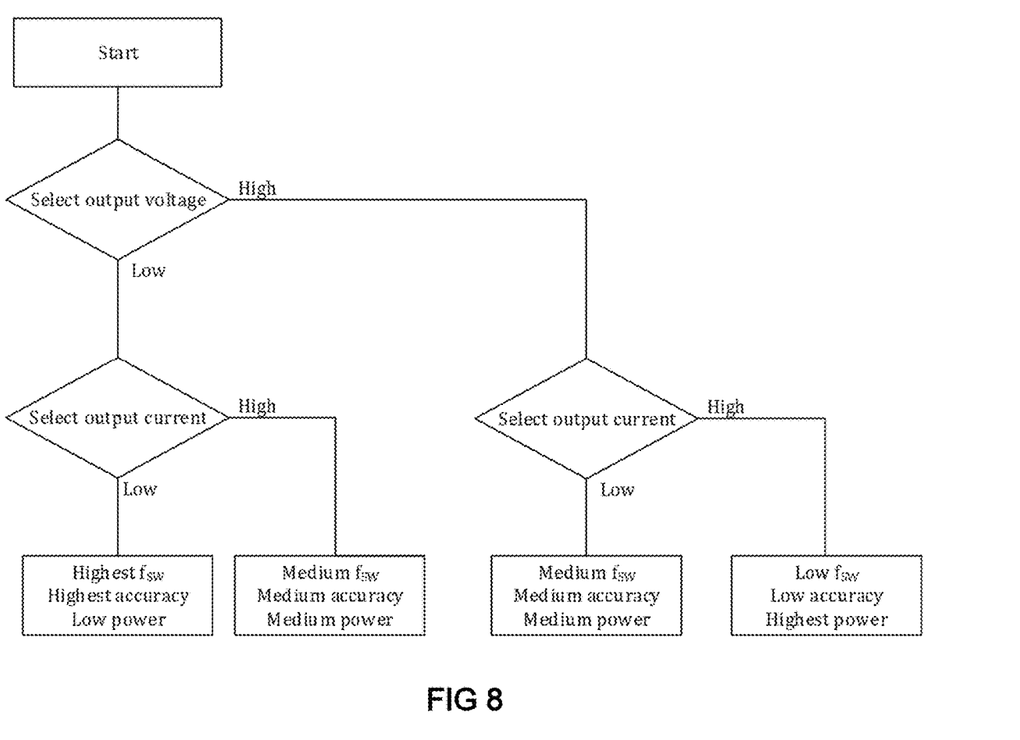
FIG. 8 represents a flow diagram of a control method for operating the voltage waveform generator according to various operational modes.

Depending on the process in the plasma chamber 102 high accuracy (e.g. atomic layer etching) or high power (e.g. sputtering) is required. For high power processes like sputtering, a lower accuracy can be tolerated. As a result, the ABVG controller 16 requires less bandwidth in such a mode of operation, allowing for a lower effective switching frequency. According to one aspect, the controller 16 is implemented with a control program or method configured to allow for selecting different modes of operation of the ABVG. By way of example, the flow chart of FIG. 8 shows possible selections. Advantageously, at least two, advantageously at least three modes of operation are implemented in the controller 16 corresponding to different power levels and/or different levels of switching frequency: low power, high power, and possibly medium power, corresponding to a low, high or medium switching frequency, respectively. The modes of operation can be selected on the basis of selection between at least two voltage levels and/or at least two current levels.

Selecting a low voltage results in a lower bus voltage (supply voltage of the buck cells). Selecting a low current results in a lower current level of the ABVG protection circuit. This protection circuit can be configured to behave in two ways. In a first case, referring to FIG. 9, the protection circuit 161 is configured as an overcurrent detection circuit configured to measure the output current (e.g. at the secondary side of transformer 14); when the current is too high, the protection circuit 161 will emit a disable signal to disable the ABVG power stage and an error is raised. In a second case, referring to FIG. 10, the protection circuit 162 is configured as a current limiting circuit configured to measure the output current (e.g. at the secondary side of transformer 14); when the current is too high the protection circuit 162 reduces the output voltage which lowers/limits the output current (behavior like a typical lab supply).

Figure 9:
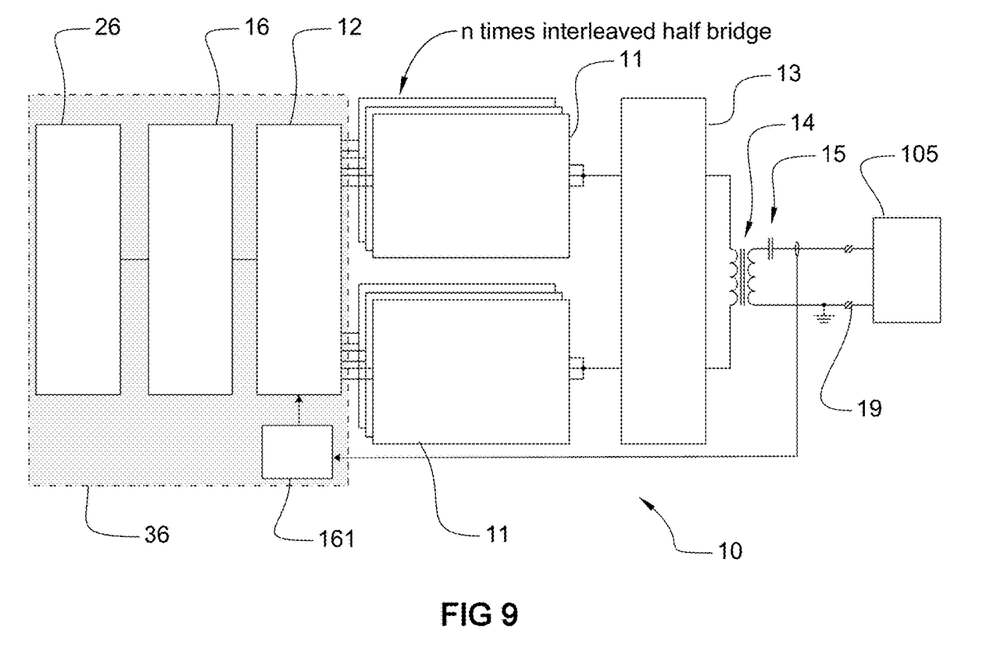
FIG. 9 represents a block diagram of a voltage waveform generator, which can be any one of the voltage waveform generators as described in relation to FIGS. 2-6, including a protection circuit for overcurrent detection.
Figure 10:
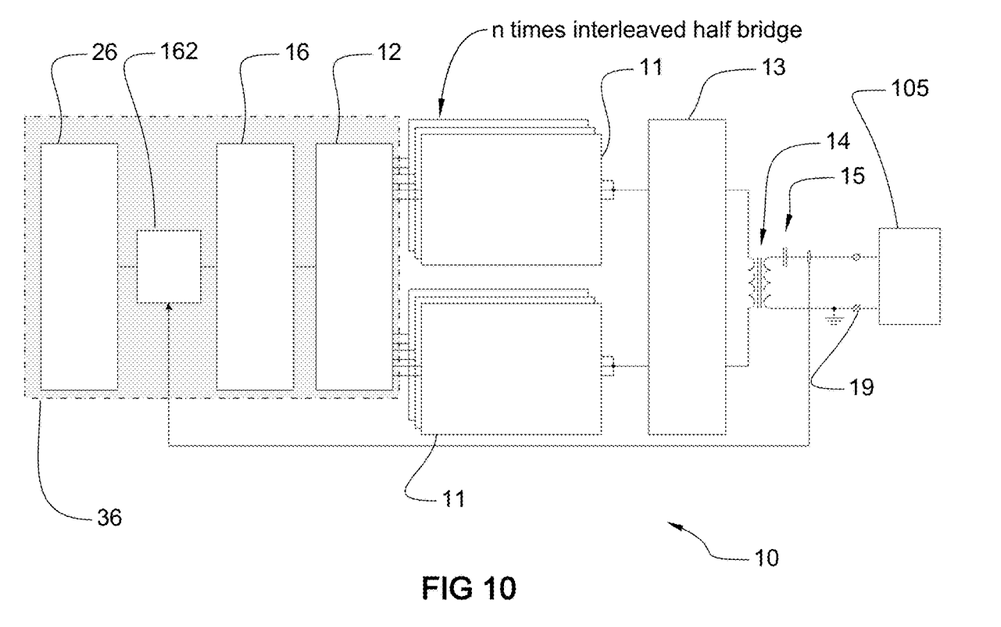
FIG. 10 represents a block diagram of a voltage waveform generator, which can be any one of the voltage waveform generators as described in relation to FIGS. 2-6, including a protection circuit for current limiting.

Referring to FIGS. 9 and 10, it will be convenient to note that the controller 16, the PWM generator 12, the waveform generator 26, any D/A converters (e.g. for the linear amplifiers), the control (feedback) loops and the protection circuit(s) 161, 162 can be integrated in one or more field-programmable gate arrays (FPGA) 36. The waveform generator 26 can be configured to provide an output voltage setpoint, optionally with predistortion. Controller 16 can comprise a control loop with feedback.

Figure 11:
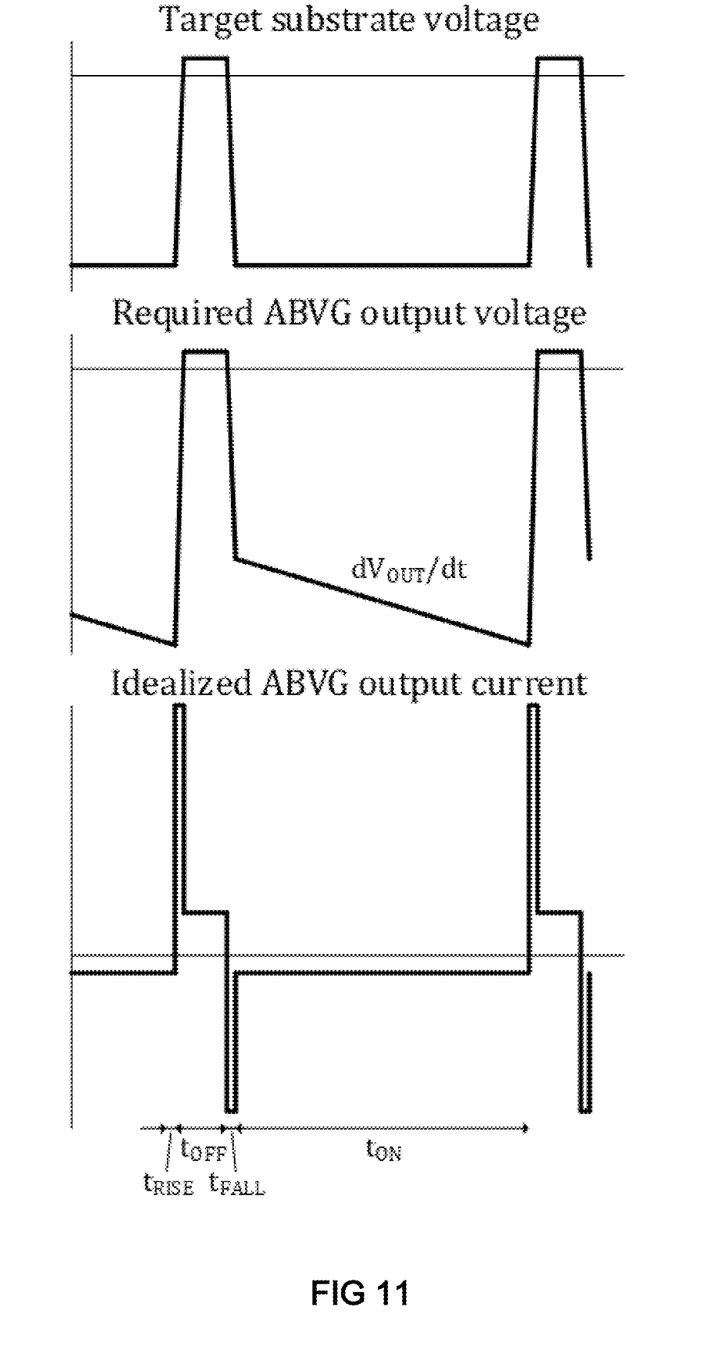
FIG. 11 represents graphs of substrate voltage, resulting arbitrary voltage waveform generator (ABVG) output current and ideal ABVG output voltage required for achieving the target substrate voltage in an optimal case.
Figure 12:
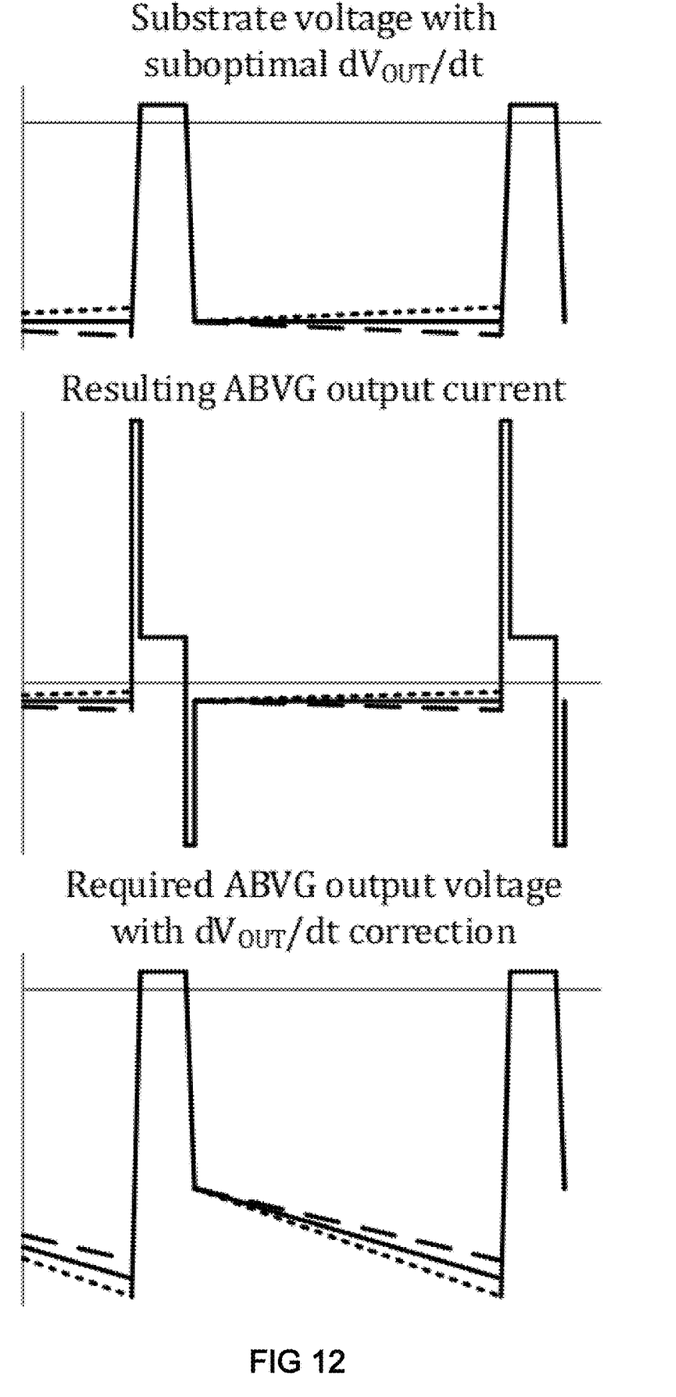
FIG. 12 represents graphs of substrate voltage, resulting ABVG output current and ABVG output voltage required for achieving the target substrate voltage in a suboptimal case.

For a narrow ion energy distribution (IED), the substrate voltage should advantageously be flat during $t_{ON}$ as shown in FIG. 11. To achieve this the capacitive charging of the substrate (and holder) is advantageously compensated by adjusting the ABVG output voltage, $dV_{OUT}/dt$ during $t_{ON}$. A flat substrate voltage during $t_{ON}$ results in a continuous ion current and therefore a continuous ABVG output current during $t_{ON}$. This can be obtained by the ABVG, by providing a current measuring unit configured to measure the ABVG output current and coupled to the controller configured to adjusting the $dV_{OUT}/dt$ during $t_{ON}$. This is one example of an indirectly measured process parameter which is used to adjust the ABVG output voltage. This improves process performance, in this case it results in better control of the IED. Referring to FIG. 12, substrate voltage, resulting ABVG output current and ABVG output voltage required for achieving the target substrate voltage in a suboptimal case are shown.

In other examples, the ABVG is configured to measure the ION flux or IED and use this information for the control of the ABVG output voltage (setpoint).

In an aspect, a method of operating the ABVG and/or plasma processing apparatus comprises a control program implementation comprising a plurality of modes of operation. A first mode of operation can correspond to a high power mode. A second mode of operation can correspond to a high precision mode. The plurality of modes of operation can distinguish by one or a combination of: a different switching frequency, a different output voltage, a different output current.

The first mode of operation which corresponds to a high power mode advantageously corresponds to a mode in which the switching frequency is low, the output voltage and current are high, e.g. they are at a maximum level. A low switching frequency advantageously results in low switching losses, and in turn higher conduction losses may be allowed and hence, the output current level can be increased. A low switching frequency is advantageous when using a high output voltage to limit switching losses.

The second mode of operation corresponding to a high precision mode can be obtained in different ways. Possibly, each of these ways can be a different mode of operation. In a first option, the output current can be limited resulting in lower conduction losses. Lower conduction losses may allow for increasing switching frequency with respect to the first mode. In this option switching frequency and output voltage can be maintained at high levels. A high switching frequency results in a high bandwidth and therefore a higher precision.

In a second option for the second mode, the output voltage is limited. Reducing the output voltage with respect to the first mode reduces switching losses which may allow for increasing switching frequency with respect to the first mode. Therefore, a higher precision can be obtained.

In a third option for the second mode, both the output voltage and the output current is limited with respect to the first mode (high power mode). This reduces both the conduction losses (due to lower current) and the switching losses (due to the lower output voltage) and therefore allows for increasing the switching frequency to a maximum level. This option may result in a maximal precision mode of operation.

In the third option, the output power may be lowest. In the first and/or second option, the output power may be intermediate between the output power obtained in the first mode and the output power obtained in the third option.

The apparatus may comprise a user interface enabling an operator to select between different modes of operation. Any one of the first to third option can be implemented in the control unit as a distinct mode of operation of the ABVG.

A feedback may be implemented in the apparatus. Feedback may be based on current and/or voltage feedback. Advantageously, a feedback control loop may be based on a measured process parameter, such as ion energy density and/or ion current through the substrate.

The invention claimed is:

1. A plasma processing apparatus, comprising:
   a plasma reactor configured to generate a plasma,
   a processing platform for configured to support a substrate to be processed, and
   a voltage waveform generator comprising an output electrically coupled to the processing platform,
   wherein the voltage waveform generator comprises:
   a plurality of first buck converters arranged in parallel and coupled to the output, the first buck converters comprising actively switchable semiconductor switches, and
   a control unit configured to operate the actively switchable semiconductor switches through pulse width modulation signals,
   wherein the control unit is configured to operate the plurality of first buck converters in an interleaved manner.

2. The plasma processing apparatus of claim 1, wherein the actively switchable semiconductor switches in each buck converter comprise a first semiconductor switch and a second semiconductor switch arranged in a half bridge configuration.

3. The plasma processing apparatus of claim 2, wherein the control unit is configured to generate phase shifted pulse width modulation signals applied to the plurality of first buck converters.

4. The plasma processing apparatus of claim 1, wherein the voltage waveform generator comprises a plurality of second buck converters arranged in parallel and coupled to the output, the second buck converters comprising actively switchable semiconductor switches,
   wherein the control unit is configured to operate the actively switchable semiconductor switches of the second buck converters through pulse width modulation signals and wherein the control unit is configured to operate the plurality of second buck converters in an interleaved manner, and
   wherein the plurality of first buck converters and the plurality of second buck converters are arranged in parallel.

5. The plasma processing apparatus of claim 4, wherein the actively switchable semiconductor switches of the second buck converters comprise in each of the second buck converters a third semiconductor switch and a fourth semiconductor switch arranged in a half bridge configuration.

6. The plasma processing apparatus of claim 1, wherein the voltage waveform generator comprises a transformer between the plurality of first buck converters and the output.

7. The plasma processing apparatus of claim 1, wherein the voltage waveform generator comprises a DC blocking capacitor between the plurality of first buck converters and the output.

8. The plasma processing apparatus of claim 7,
   wherein the voltage waveform generator comprises a transformer between the plurality of first buck converters and the output; and
   wherein the DC blocking capacitor is coupled between a secondary side of the transformer and the output.

9. The plasma processing apparatus of claim 1, wherein the voltage waveform generator comprises a linear power amplifier coupled to the output.

10. The plasma processing apparatus of claim 9, wherein the control unit is operable to control operation of the linear power amplifier.

11. The plasma processing apparatus of claim 9, wherein the linear power amplifier is coupled in parallel with the first buck converters.

12. The plasma processing apparatus of claim 9, comprising a filter arranged in series with the first buck converters and coupled to the output, wherein the linear power amplifier is coupled in parallel with the series of the first buck converters and the filter.

13. The plasma processing apparatus of claim 1, wherein the voltage waveform generator is operable to provide a voltage bias to an exposed surface of the substrate.

14. The plasma processing apparatus of claim 1, wherein the control unit is configured to operate the actively switchable semiconductor switches of the first buck converters to generate a predetermined voltage waveform at the output.

15. The plasma processing apparatus of claim 1, wherein the voltage waveform generator is operable to generate an AC voltage at the output.

16. The plasma processing apparatus of claim 1, wherein the control unit is implemented with a plurality of modes of operation of the voltage waveform generator.

17. The plasma processing apparatus of claim 16, wherein the plurality of modes of operation comprise modes of operation resulting in one or a combination of different output voltage levels and different output current levels.

18. The plasma processing apparatus of claim 16, wherein at least one mode of operation of the plurality of modes of operation comprises operating at a limited output current and/or a limited output voltage.

19. The plasma processing apparatus of claim 16, wherein the plurality of modes of operation are distinguished by a different switching frequency of the actively switchable semiconductor switches.

20. The plasma processing apparatus of claim 1, arranged to measure a process parameter being one or more of an ion energy density and an ion current through the substrate, and wherein the voltage waveform generator comprises a control loop on the basis of the measured process parameter.

* * * * *

UNITED STATES PATENT AND TRADEMARK OFFICE
CERTIFICATE OF CORRECTION

| | |
|---|---|
| PATENT NO. | : 11,968,771 B2 |
| APPLICATION NO. | : 17/291976 |
| DATED | : April 23, 2024 |
| INVENTOR(S) | : Antonius Wilhelmus Hendricus Johannes Driessen and Wouter Johan Hendrik Van Gennip |

It is certified that error appears in the above-identified patent and that said Letters Patent is hereby corrected as shown below:

In the Claims

At Column 7, Line 64, Claim 1, the text "a processing platform for configured to support a substrate to be processed" should read --a processing platform configured to support a substrate to be processed--.

Signed and Sealed this
Fourth Day of June, 2024

Katherine Kelly Vidal
Director of the United States Patent and Trademark Office